United States Patent [19]

Whitney et al.

[11] 4,164,705

[45] Aug. 14, 1979

[54] BRUSHLESS EXCITER FAULT INDICATOR SYSTEM

[75] Inventors: Eugene C. Whitney, Pittsburgh; Dale I. Gorden, North Versailles, both of Pa.

[73] Assignee: Westinghouse Electric Corp., Pittsburgh, Pa.

[21] Appl. No.: 680,658

[22] Filed: Apr. 27, 1976

[51] Int. Cl.² .................. G01R 31/22; G01R 31/02; H02K 11/00
[52] U.S. Cl. .................. 324/158 MG; 310/68 D; 322/99; 324/51; 324/158 D
[58] Field of Search .......... 324/158 MG, 127, 158 D, 324/51; 318/490; 322/99; 310/68 R, 68 B, 68 C, 254, 259, 68 D; 340/645

[56] References Cited

U.S. PATENT DOCUMENTS

| 2,640,100 | 5/1953 | Packer et al. | 324/158 MG |
| 2,939,074 | 5/1960 | Perrett | 324/158 MG |
| 3,506,914 | 4/1970 | Albright et al. | 324/51 |
| 3,624,504 | 11/1971 | Joly | 324/158 MG |
| 3,932,811 | 1/1976 | Branch | 324/158 MG |

FOREIGN PATENT DOCUMENTS 1903410 1/1969 Fed. Rep. of Germany ... 324/158 MG
1288679 2/1969 Fed. Rep. of Germany ... 324/158 MG

OTHER PUBLICATIONS

Birch et al.; CPEM Conf. on Precision; pp. 41-43; Jul. 1-5, 1974; London.

Primary Examiner—Rudolph V. Rolinec
Assistant Examiner—Ernest F. Karlsen
Attorney, Agent, or Firm—G. H. Telfer

[57] ABSTRACT

A brushless excitation system for a synchronous dynamoelectric machine includes an alternating current exciter and a rotating rectifier assembly. In such a system, the alternating current exciter includes a salient pole stator field member and a polyphase armature rotor member. A sensing coil is disposed around at least one of the salient stator poles for developing an alternating electrical signal in response to changes in the magnetic flux wave linking the rotating armature member and the field coil of the salient stator pole member. Means connected to the sensing coil indicates variations in the alternating current signal which correspond with disturbances in the rotary electric circuit of the brushless exciter such as a line-to-line short circuit or a phase-to-phase short circuit in the armature winding, or shorted diodes or open fuses in the rotating rectifier assembly.

5 Claims, 9 Drawing Figures

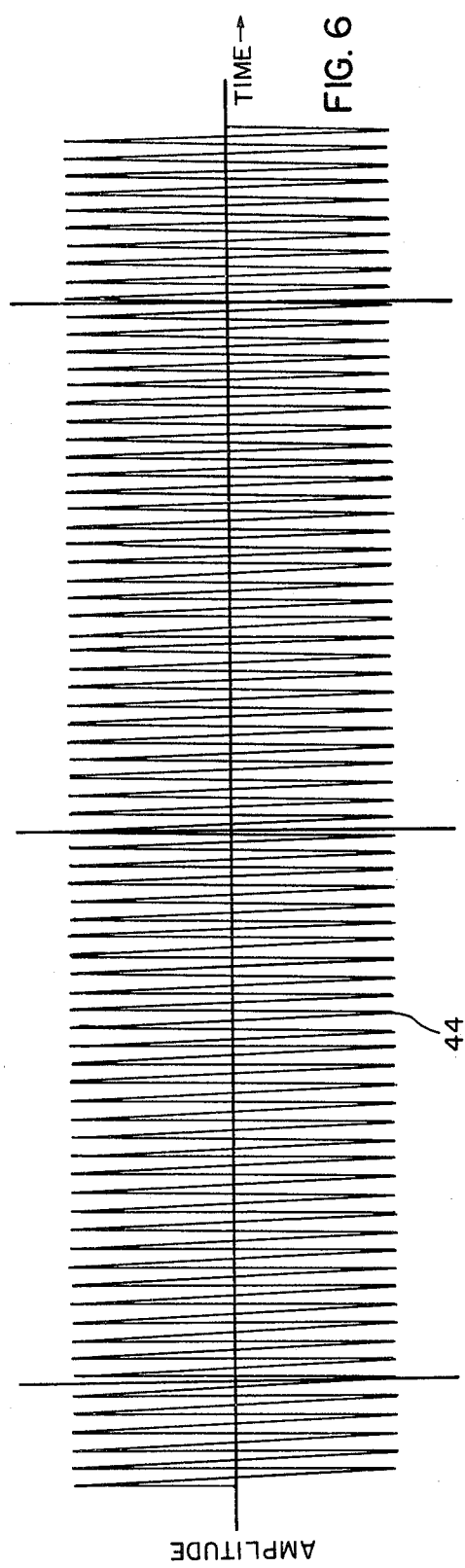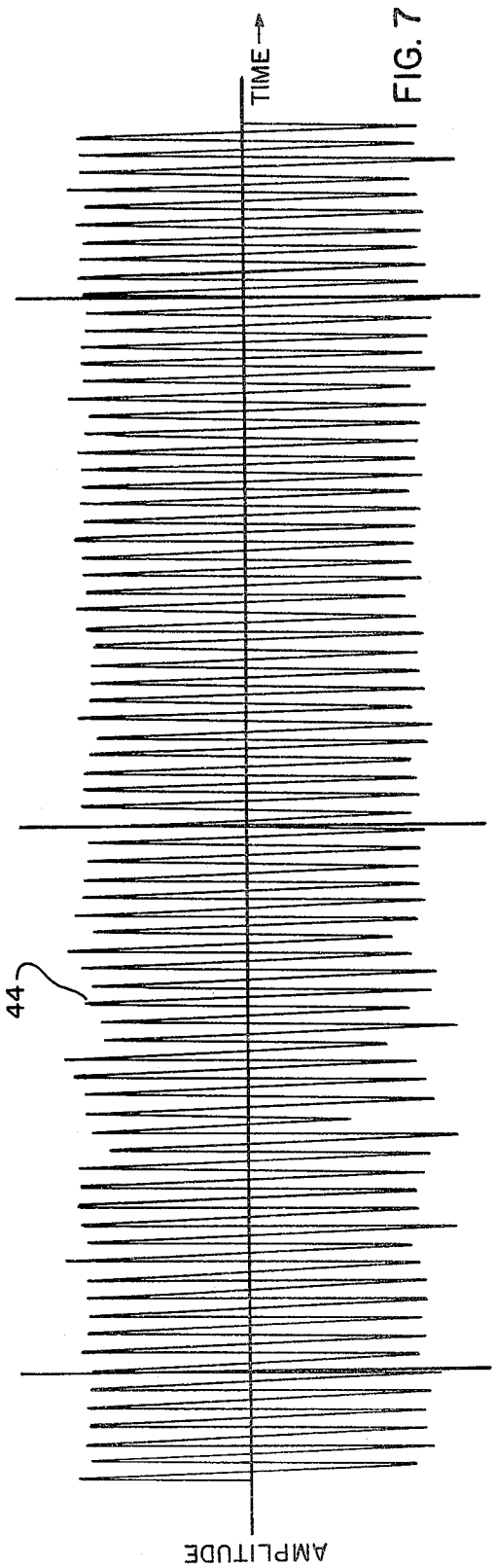

BRUSHLESS EXCITER FAULT INDICATOR SYSTEM

BACKGROUND OF THE INVENTION

1. Field of the Invention

The present invention relates to brushless excitation system for synchronous dynamoelectric machines, and more particularly to means for detecting faults in the rotary electric circuits of brushless exciters.

2. Description of the Prior Art

Brushless excitation systems are now widely used for supplying direct current field excitation to synchronous dynamoelectric machines such as large alternating current generators. Such brushless excitation systems include an alternating current exciter having a stationary field structure and a rotating armature member. A rotating rectifier assembly is carried on a common shaft with the exciter armature and is connected thereto to provide a direct current output. The output of the rectifier is supplied to the field winding of the main generator which also rotates with the exciter armature and rectifier. In this way, an excitation system is provided which requires no commutator or slip rings and no sliding contacts. This arrangement is particularly useful in certain operating environments, such as power plants, refineries, and chemical process plants, where it is desirable to eliminate the brushes, commutators, or other sliding contacts of conventional machines where associated maintenance problems and sparking may be unacceptable.

A problem of great concern in brushless excitation systems is the detection of rotary circuit malfunctions such as shorted diodes or open fuses in the rotating rectifier assembly, line-to-line short circuits in the rotating armature winding, and phase-to-phase short circuits in the armature winding. Conventional fault detection apparatus which employs slip rings for transmitting the fault information cannot be used in operating environments where it is desirable to avoid the use of sparking surfaces as discussed above. Thus, it is desirable to provide some alternate means which does not employ the use of slip rings or other sparking surfaces to provide an indication of circuit disturbances within the rotary electric circuits of the brushless exciter. A line-to-line or phase-to-phase short circuit within the armature winding of the exciter, if undetected, may result in severe and costly damage to the synchronous machine of which it is a part and consequential damage to the equipment to which it delivers power. The effect is particularly serious in the case of a large synchronous generator which supplies critical power to users who may be severely damaged by a sudden power fluctuation or reduction. Therefore, early detection of a circuit disturbance within the rotary armature or rotating rectifier circuit of the brushless exciter is important since such a machine may continue to operate in apparently normal fashion even after one or more line-to-line shorts occur or one or more fuses become opened. However, a point may be reached whereupon subsequent occurrence of further circuit disturbances within the rotating armature or rotating rectifier circuits will have a cumulative effect which may result in the destruction of the exciter. It is important, therefore, for those maintaining and using the synchronous machine to become aware of such disturbances upon their occurrence so that corrective action can be initiated either immediately or at regular maintenance intervals before catastrophic failure occurs.

In conventional dynamoelectric machines, indications of malfunctions within the rotary armature winding and rotating rectifier assembly have been practical only on those machines having brushes and slip rings since these devices provide the means for communicating the malfunction information to points external of the rotor. Brushless exciters have no slip rings and, therefore, have no mechanical link by which armature winding and rectifier malfunction information can be provided. Transmission of failure data by radio telemetry is feasible, but is relatively expensive.

Presently, a strobe light arrangement has been utilized satisfactorily for detecting a failure of the fuse members within the rotating rectifier assembly. However, in this arrangement, the fuse must be located in a position for physical inspection of a fuse indicator which is actuated when the fuse is opened. As a result, the fuses are mounted on the end surface of rectifier wheels. As the synchronous dynamoelectric machines become larger, the number of fuses are increased or their size is increased, with the result that the diode wheel diameter increases and becomes prohibitively large.

SUMMARY OF THE INVENTION

In accordance with the present invention, improved means are provided for detecting and indicating faults in the rotating armature winding and in the rotating rectifier assembly of the brushless exciter of a synchronous dynamoelectric machine without the use of brushes and slip rings or other such means directly connected to the rotating parts of the brushless exciter. While the invention has particular utility in detecting faults in the rotary circuit of a brushless exciter for a synchronous dynamoelectric machine, it has general utility for any dynamoelectric machine having a stator member with a plurality of salient field poles and a rotatable armature member having an armature winding.

In accordance with the present invention, a sensing coil is disposed on a selected one of the salient stator field poles for developing an alternating current signal in response to changes in the magnetic flux wave which links the armature winding with the field coil of the selected salient pole. Means such as an oscilloscope, a strip chart recorder, or an alarm device, is connected to the sensing coil to indicate variations in the alternating current signal. The variations in the waveform of the induced alternating current signal correspond to known disturbances such as line-to-line armature short circuits, phase-to-phase armature short circuits, shorted or open diodes in the rotating rectifier assembly, and open fuses in the rotating rectifier assembly. At each commutation interval there is a particular pattern of voltage or current pulsation. Irregularities in the pattern will indicate the particular problem involved to an experienced observer.

In a synchronous dynameoelectric machine, the space fundamental component of the air gap flux, assuming an uniform air gap machine, is determined by the combined influence of the field and armature magnetomotive forces. Under normally balanced operating conditions, that is, in the absence of disturbances such as line-to-line armature short circuits, phase-to-phase armature short circuits, shorted diodes or open fuses in the rotating rectifier assembly, the direct axis armature reaction flux wave is directly opposite of the field poles and is in the opposite direction to the field flux wave. Assuming balanced steadystate conditions, the armature currents induced by the stator field winding can be resolved into time quadrature components which produce two synchronously rotating components of armature reaction, one in line with and the other in space quadrature with the axes of the field poles. For the purposes of the present invention, a direct axis quantity is one whose magnetic effect is centered on the axes of the stator field poles, and a space quadrature quantity is one whose magnetic effect is centered along a line intermediate of the axes of the stator field poles.

The resultant air gap flux can be considered as the vector sum of the component fluxes created by the field and armature reaction magnetomotive forces. Balanced polyphase armature currents in a symmetrical polyphase armature winding create a magnetomotive force wave consisting of a constant amplitude space fundamental component rotating in synchronous speed and a family of comparatively small harmonic components. Thus, any change in the balanced condition of the rotating armature circuit will cause a corresponding change in the magnitude of the direct axis flux wave or quadrature axis flux wave in the air gap between the armature and stator. This balance will be upset by any of the failures noted above and will cause a corresponding change in the amplitude of the alternating current signal induced within a sensing coil disposed on one of the salient field pole members, or disposed in a space quadrature relation with the field pole members.

The sensing coil arrangement of the present invention is also useful for detecting some types of rotor unbalance. The indicating means will show an output having a modulation due to the eccentricity of the rotor. With an unbalanced, eccentric rotor assembly, the air gap dimension will vary as the armature rotates. This variation is indicated by modulation of the waveform of the alternating current signal induced by the flux wave in the sensing coil.

A further advantage of the present invention is that it provides positive indication of the exact diode or fuse which has failed. This advantage is provided in a rotating rectifier assembly which is energized by a polyphase armature winding each phase of which consists of a number of parallel legs, each leg being fused and connected to an individual rectifying element. In such an arrangement, the coils comprising each parallel leg of each phase are angularly displaced and are distributed equally in slots adjacent to the air gap around the periphery of the armature. Because these windings are displaced in space with respect to one another, the current induced in each parallel leg is shifted in time and phase with respect to each next adjacent winding. Therefore, assuming uniform winding distribution, the alternating current signal induced in the sensing coil is characterized by a symmetrical waveform comprising a series of alternating positive and negative pulses, each pulse representing the contribution of a particular parallel leg portion of the armature winding. If the armature winding is uniformly distributed, the amplitude of these pulses will be the same when all diodes and fuses are conducting properly. However, when a fuse becomes open circuited, the contribution of that particular parallel leg of the armature winding is lost and the corresponding waveform of the alternating current signal induced in the sensing coil is distorted and becomes asymmetrical as that portion of the armature rotates past the stator structure on which the sensing coil is disposed. Therefore, the fault sensing means of the present invention provides an extremely simple and accurate means for pinpointing the exact identity and location of a failed diode or fuse within the rotating rectifier assembly. This greatly reduces the downtime formerly expended in testing each diode and fuse of the rotating rectifier assembly which in some cases contains as many as 120 diodes and 120 fuses. Furthermore, indication of a failed diode and fuse is provided immediately so that the appropriate corrective action can be taken before catastrophic failure occurs.

BRIEF DESCRIPTION OF THE DRAWINGS

The invention will be more fully understood from the following detailed description taken in connection with the accompanying drawings, in which:

FIG. 6 is a graphical representation of an alternating voltage waveform induced in the sensing coil of the present invention by a normally operating armature winding;

FIG. 7 is a graphical representation of the alternating voltage waveform induced in the sensing coil of the present invention by a rotating armature winding having an open fuse in one of its winding members;

DESCRIPTION OF THE PREFERRED EMBODIMENT

Figure 1:
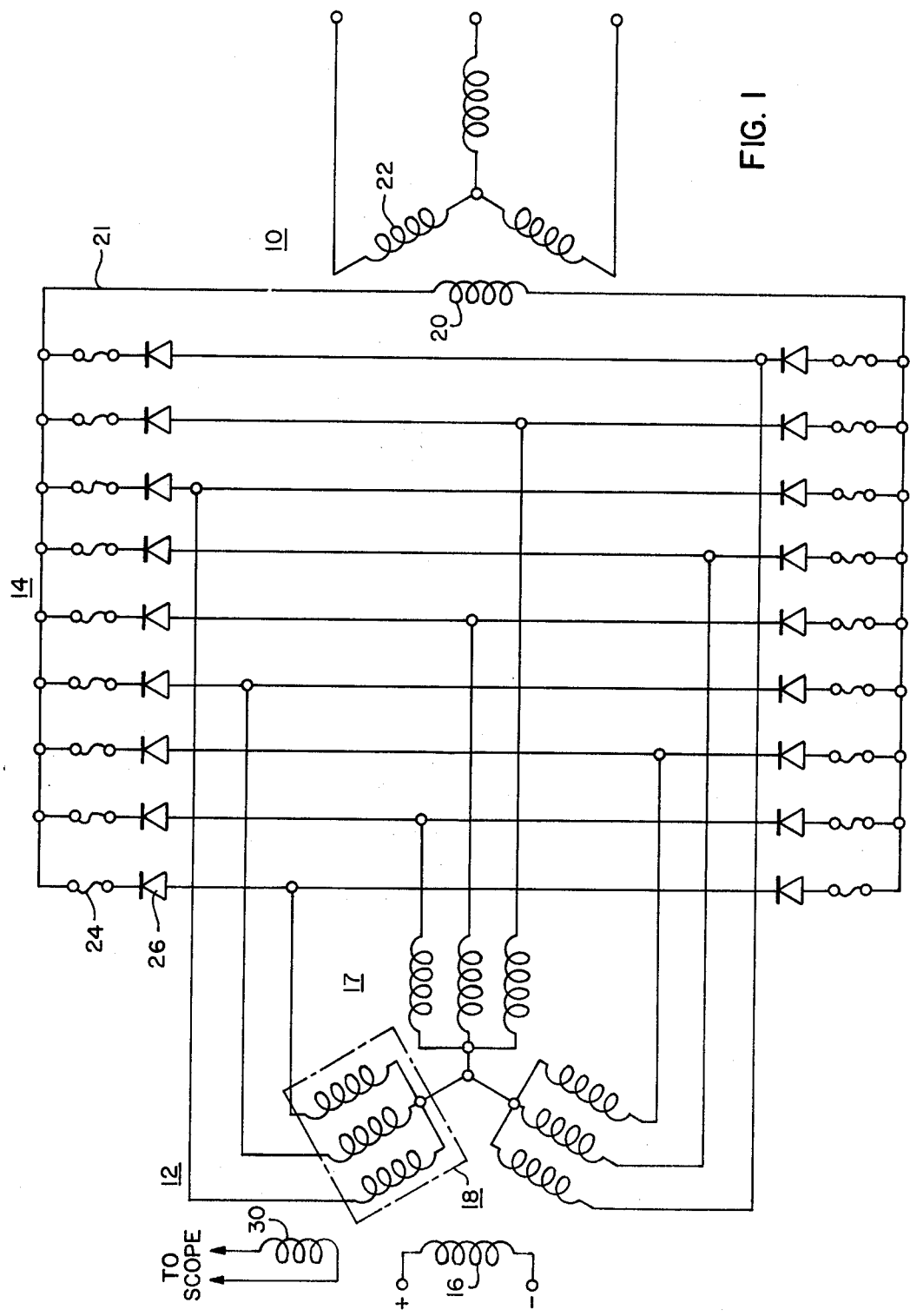
FIG. 1 is a simplified diagram of a brushless excitation system in combination with a synchronous dynamoelectric machine in which the invention is incorporated.
Figure 2:
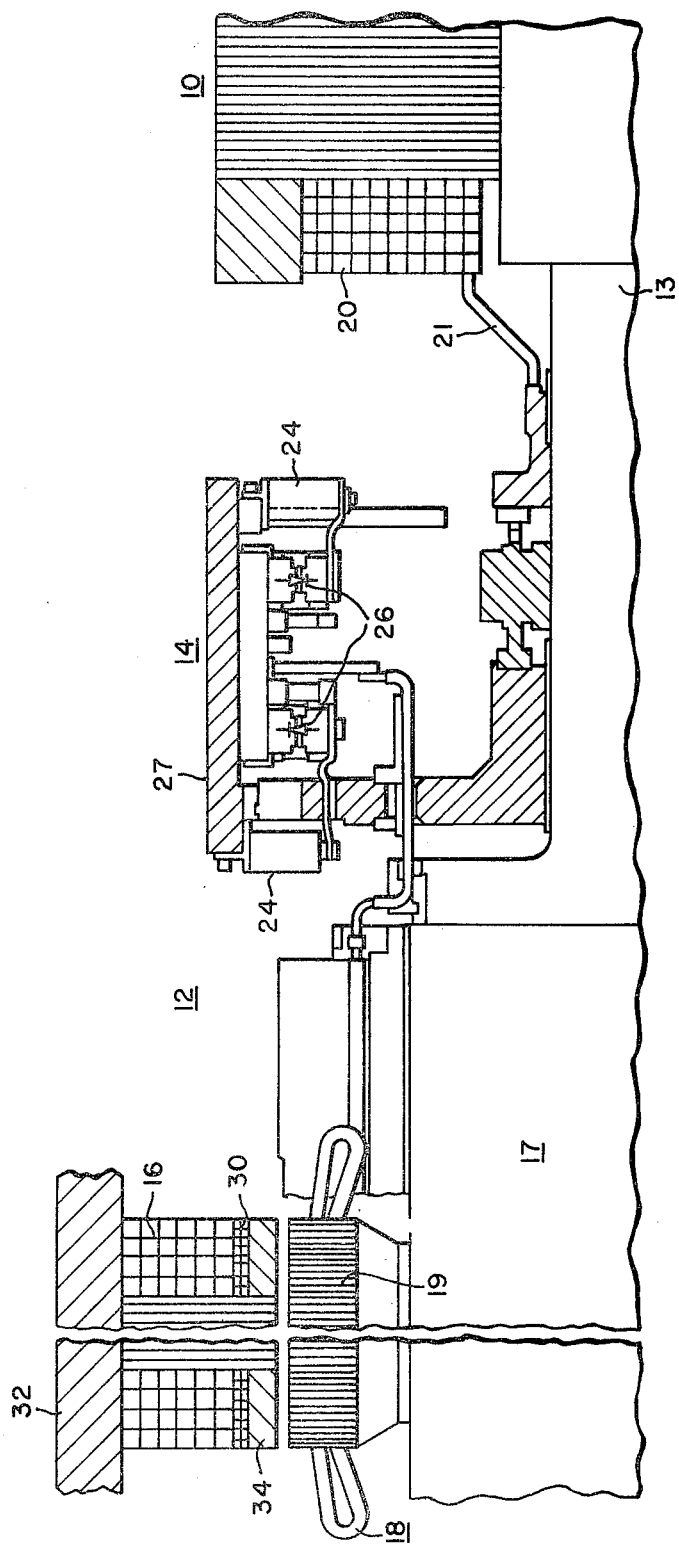
FIG. 2 is an axial plane view, partly in section, of the brushless exciter and rotating rectifier of FIGS. 1 and 3.

Referring now to FIG. 1 and FIG. 2, the invention is shown in combination with a synchronous dynamoelectric machine 10 which includes a brushless excitation system having an alternating current exciter 12 and a rotating rectifier assembly 14 mounted on a common shaft 13 for rotation together. The alternating current exciter 12 may be of any suitable type having a stationary stator field structure 16 including salient poles and a rotating armature member 17. The armature member 17 of the exciter 12 is shown as having a three-phase winding 18 disposed in a core 19 and carried on the shaft 13 so as to be rotatable with the field winning 20 of the dynamoelectric machine 10. The armature winding 18 is connected to the rotating rectifier assembly 14 to provide direct current output for excitation of the field winding 20. The exciter armature winding 18, the rectifier assembly 14, and the field winding 20 are all carried on the same shaft 13, or are otherwise rotatable together on a common rotating member.

The armature winding 18 of the exciter 12 may be of any desired configuration having any suitable number of branches per phase. In a preferred embodiment of the present invention, each parallel of each phase is connected individually to a fuse 24 which is connected in series with a diode 26. The parallel windings are angularly displaced with respect to one another and are distributed equally in slots adjacent to the air gap around the periphery of the armature core 19 of the exciter 12 as illustrated in FIG. 3.

The rotating rectifier assembly 14 includes a rectifier support wheel 27 on which the fuses 24 and the rectifier diodes 26 are supported against the high centrifugal forces which occur during operation.

Figure 3:
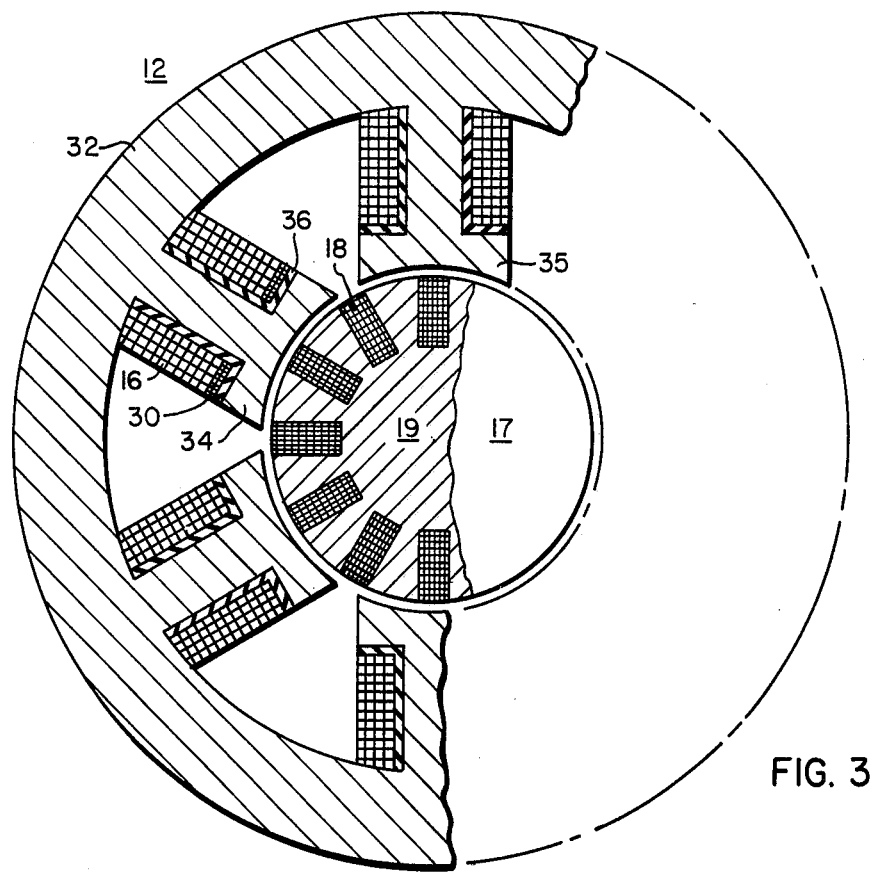
FIG. 3 is a transverse view, partly in section, of a synchronous dynamoelectric machine in which the invention is incorporated.

A sensing coil 30 is shown as being magnetically coupled with the exciter stator field winding 16 in FIG. 1 and is further illustrated in FIGS. 3, 4, 8 and 9. In FIG. 3, a cross-section of the alternating current exciter 12 is illustrated. The exciter 12 includes an annular stator core 32 having a plurality of salient pole portions 34 about which the stator field winding 16 is wound. According to a preferred embodiment of the invention, the field winding 16 encircles each of the salient poles 34, preferably in a first plane parallel to the axis of the armature member, and the sensing coil 30 encircles a selected one of the salient poles 34 in a second plane which is parallel to the plane of the field coil. In a preferred embodiment of the present invention, the sensing coil 30 is concentrically disposed about the selected salient stator field pole 34 and is located radially inward of the associated field coil 16 relative to the axis of the armature 17.

Figure 4:
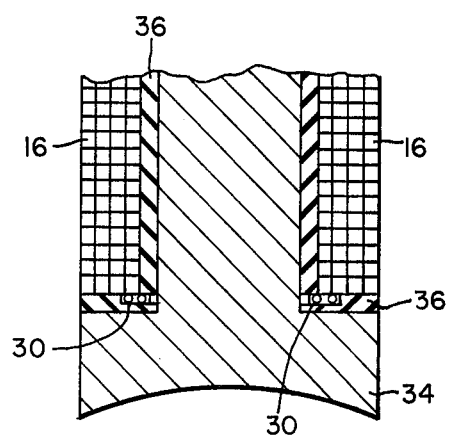
FIG. 4 is an enlarged view of a salient stator field pole of the dynamoelectric machine of FIG. 3.

According to FIG. 4, the sensing coil 30 is preferably disposed within a layer of electrical insulation 36 which isolates the high voltage field winding 16 from the stator salient pole member 34. The sensing coil 30 is very small as compared with the field coil 16 and, because of the large magnitude of the magnetic flux passing from the rotor to the stator, only a few turns are required to develop the alternating current signal. Consequently, the sensing coil 30 may comprise only one turn and may be wholly disposed within the insulation layer 36. Because of its small size, the sensing coil 30 occupies very little of the usable field volume surrounding the salient pole 34. Therefore, the sensing coil 30 can be combined with the field winding of a salient pole stator assembly without diminishing the field strength or thermal capacity of the field coil with which it is associated.

Figure 5:
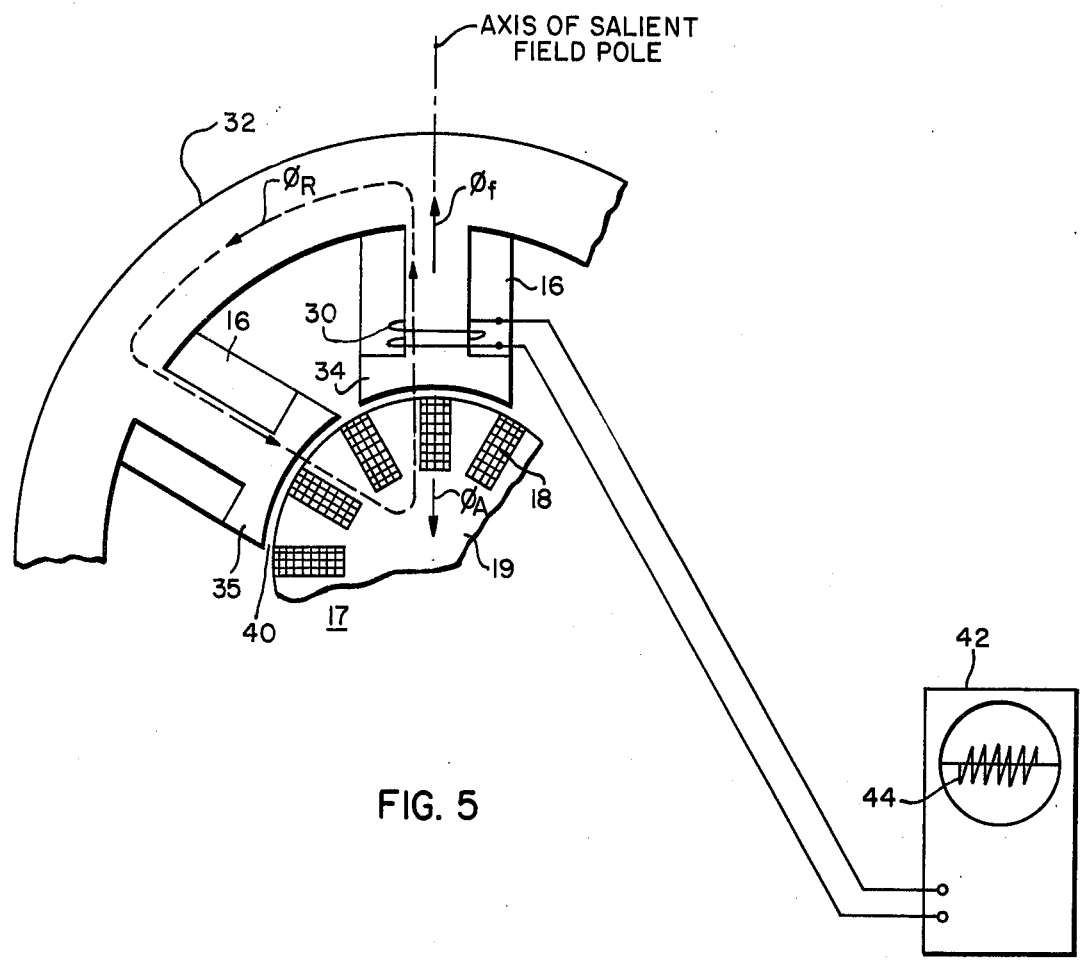
FIG. 5 is a schematic representation of the flow of magnetic flux from the rotating armature member through an adjacent salient field pole of the dynamoelectric machine of FIG. 3.

Operation of the sensing coil 30 in combination with means for indicating variations of an alternating current signal induced into the sensing coil is illustrated in FIG. 5. The armature assembly 17 is concentrically disposed within the annular stator member 32 to define a radial air gap 40. Adjacent salient stator field poles 34, 35 comprise adjacent north-south magnetic pole pairs when the field winding 16 is energized by a direct current source (not shown). The armature assembly 17 is caused to rotate by a prime mover (not shown), and as the polyphase winding 18 is moved through the field established by the field winding 16, current is induced within the armature winding and gives rise to an armature reaction flux wave having a radial component $\phi_A$ which is directly opposite the stator salient field pole 34 and is in the opposite direction to a field flux wave $\phi_f$ which is generated by current passing through the field winding 16. The resultant direct axis flux wave $\phi_R$ passes through the air gap 40 into the salient field pole 34 and circumferentially around the stator 32 where it is returned by the opposite salient magnetic pole 35 through the air gap again to the armature core member 19 as indicated by the dashed line. Changes in the direct axis flux wave (due to commutation between diodes and phases) passing through the salient pole member 34 gives rise to an alternating electrical signal in the sensing coil 30 which is shown connected to an oscilloscope 42 having its sweep circuit synchronized with the rotation of the armature 17 for a visual presentation 44 of the changes in the induced signal. Other suitable indicating means such as an alarm may also be used to good advantage.

Figure 8:
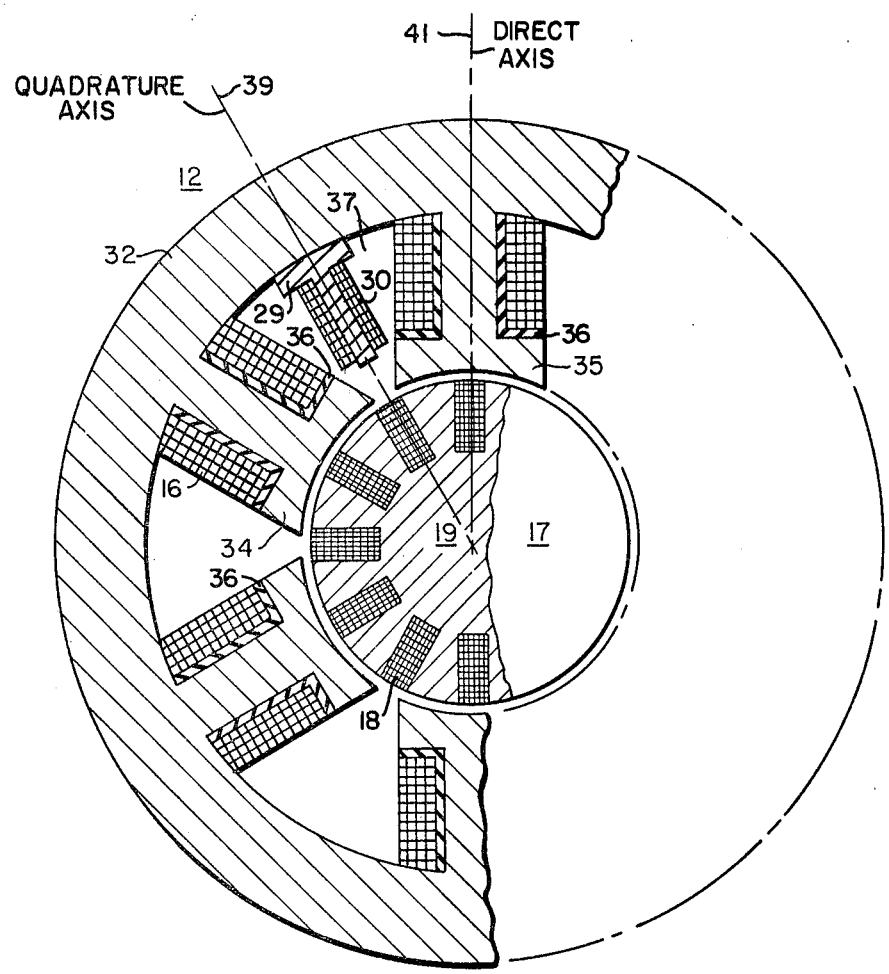
FIG. 8 is a partial sectional view of the alternator of the brushless exciter of FIG. 2 in which a sensing coil is disposed in quadrature relation with respect to adjacent salient pole members.
Figure 9:
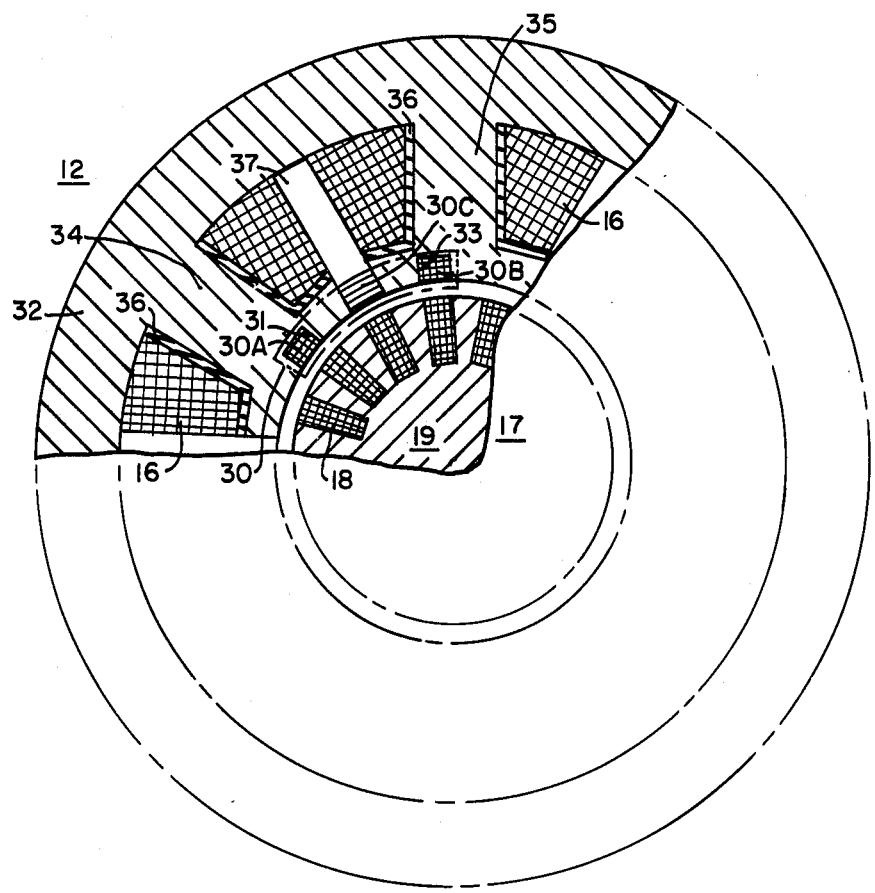
FIG. 9 is a partial sectional view of the alternator of FIG. 8 in which end turn portions of the sensing coil are embedded in slotted portions of adjacent salient poles.

In most salient pole dynamoelectric machines the quadrature axis component of $\phi_A$ may also be utilized in the same manner as the direct axis flux component to provide armature malfunction information. Two such arrangements are illustrated in FIGS. 8 and 9. In FIGS. 8, 9 the sensing coil 30 is disposed in quadrature relation with respect to the adjacent salient pole members 34, 35 to permit the quadrature axis flux component to be sensed. In FIG. 8, the sensing coil 30 is disposed in an interpolar space 37 between the adjacent salient poles 34, 35 and is supported by a bracket 29 which is suitably secured to the exciter stator core 32. The bracket 29 is preferably constructed from a material which is a good conductor of magnetic flux. The sensing coil 30 concentrically disposed about the bracket 29 and its magnetic axis coincides with the quadrature axis 39.

Referring now to FIG. 9, according to an alternate construction, side turn portions 30A and 30B of the sensing coil are disposed within slots 31, 33 in the pole face regions of the poles 34, 35 and extend across the interpolar space 37. In this location the magnetic axis of the sensing coil 30 lies in quadrature relation with respect to the direct axis 41 of the adjacent salient pole 35.

Under normal operating conditions, for example with all diodes and fuses conducting in the rotating rectifier assembly, and no armature winding open or short circuits, the currents induced in each of the parallel legs of the winding 18 are displaced in phase and time because of the angular displacement of the parallel legs around the circumference of the armature assembly 17. The output waveform of the sensing coil 30 under balanced conditions appears as a series of narrow pulses having equal amplitudes but displaced in time in increments which correspond directly with the angular displacements of each of the parallel legs of the polyphase winding 18. Thus the contribution of each parallel leg of the winding 18 may be identified on the face of the oscilloscope 42. The output waveform of the sensing coil 30 for balanced, normal operating conditions is shown in FIG. 6. It should be noted that the output pulses are substantially equal in magnitude and are displaced in time with respect to each other to form a symmetrical, alternating waveform.

In the event of a disturbance such as the failure of a fuse in the rotating rectifier assembly 14, the contribution of the armature winding parallel leg to which it is connected is brought to zero and the overall direct axis flux wave is diminished during the time period that the diode for that particular parallel leg would normally be conducting. Thus, the amplitude of the output pulse for that particular time period is distorted with respect to the adjacent pulses of the output waveform because of an uneven flux change due to a smaller or different demagnetizing component of armature current. The pulses may appear to be somewhat disturbed in the phases on adjacent poles but can be distinguished from the problem circuit. This is shown graphically by FIG. 7. The sensing coil 30 thus provides an indication of the differences in an otherwise uniform flux wave which is disturbed because of a failure in the rotary armature circuit such as turn-to-turn short circuit, phase-to-phase short circuit, a blown fuse, or an open or shorted diode. The sensing coil 30 continuously monitors the direct axis flux wave passing through the salient pole 34 or through the quadrature axis space and provides an indication of an armature disturbance for a particular armature component failure each time the armature sweeps past the salient stator field pole or space quadrature axis position with which the sensing coil 30 is associated.

Because the sensing coil 30 is concentrically disposed with respect to the quadrature axis or direct axis of the salient poles, it does not extent into the air gap 40, and thus cannot interfere with the rotation of the armature member, which is a potential point of failure in prior art sensing devices which are physically located within the air gap. For an example of an air gap sensing coil arrangement, see U.S. Pat. No. 3,506,914. It should be noted that the sensing coil arrangement of the present invention is especially useful and practical for dynamoelectric machines having a very small air gap which is generally not compatible with sensing coils which are inserted directly within the air gap. Thus, the sensing coil 30 is not in close proximity to the rotor which would add a potential point of failure in the event of rotor pullover. It should furthermore be noted that because the sensing coil is mounted upon the stationary stator member, connection of the oscilloscope 42 or other such indicating means may be conveniently made without resorting to intermediate signal coupling means such as a brush and slip ring arrangement, or an expensive radiotelemetry arrangement.

Although a particular embodiment of the invention has been shown and described for the purpose of illustration, it will be apparent that other embodiments and modifications are possible within the scope of the invention.

What is claimed is:

1. In a synchronous dynamoelectric machine with brushless excitation, the combination comprising: a main machine rotor member having field coils connected together to form a main rotor field winding, an alternating current exciter having a stator field member and a plurality of salient stator poles thereon, stator field coils disposed on said salient poles and connected together to form a stator exciter field winding, an exciter armature member rotatable with said main rotor field winding and having an armature winding thereon, said exciter armature winding being coupled magnetically with said exciter stator field winding for developing an alternating current excitation signal within said armature winding, rectifier means interconnecting said exciter armature winding and said main rotor field winding to provide direct current excitation to said main rotor field winding, said rectifier means being rotatable with said armature, a sensing coil disposed around a selected one of said salient stator poles of said exciter for developing an alternating electrical signal in response to changes in the magnetic flux wave linking said rotating exciter armature member and the field coil of said selected salient pole, including changes due to faults in said armature winding and in said rectifier means, and means connected to said sensing coil to indicate variations in said alternating electrical signal.

2. A synchronous dynamoelectric machine as defined in claim 1, said exciter armature member including a cylindrical core having winding slots disposed about the circumference of said core, said armature winding including a plurality of coils constituting each phase of said winding, said coils being disposed in said core slots and being angularly displaced with respect to one another, said coils being electrically connected together in parallel within each phase of said armature winding, said rectifier means including a plurality of series connected diode and fuse pairs, at least one series connected diode-fuse pair being connected in series with each said parallel-connected phase coil.

3. In brushless exciter apparatus, the combination comprising: a shaft, a rotatable armature member disposed on said shaft, said armature having an armature winding electrically connected with a rectifier assembly that is rotatable with said armature, a stator member with a plurality of salient poles that are concentrically disposed about and spaced apart from said armature, a stator field coil disposed on each said salient pole, said stator field coils being connected together to constitute a stator field winding;

a sensing coil disposed on a selected one of said salient stator poles for developing an alternating electrical signal in response to changes in the magnetic flux linking said armature winding with the field coil of said selected salient pole, including changes due to faults in said armature winding and in said rectifier assembly, said field coils each encircling one of said poles in a first plane parallel to the axis of said shaft, said sensing coil encircling said selected salient pole in a second plane parallel to said first plane and being located radially inward of the associated field coil relative to the axis of said shaft; and means connected to said sensing coil to indicate variations in said alternating electrical signal.

4. The combination defined in claim 3, said indicating means comprising an oscilloscope having its sweep synchronized with the rotation of said armature.

5. The combination defined in claim 3, including a layer of electrical insulation disposed intermediate of said selected one of said salient field poles and the associated field coil, said sensing coil being disposed within said insulation.

* * * * *